US005780904A

United States Patent [19]

Konishi et al.

[11] Patent Number: 5,780,904

[45] Date of Patent: Jul. 14, 1998

[54] SEMICONDUCTOR INTEGRATED CIRCUIT DEVICE FOR OBTAINING EXTREMELY SMALL CONSTANT CURRENT AND TIMER CIRCUIT USING CONSTANT CURRENT CIRCUIT

[75] Inventors: Haruo Konishi; Masanao Hamaguchi; Masanori Miyagi, all of Chiba, Japan

[73] Assignee: Seiko Instruments Inc., Japan

[21] Appl. No.: 671,941

[22] Filed: Jun. 28, 1996

[51] Int. Cl.[6] .................... H01L 27/06

[52] U.S. Cl. .................... 257/369; 257/368; 257/348; 257/402

[58] Field of Search .................... 257/369, 368, 257/348, 402, 213

[56] References Cited

U.S. PATENT DOCUMENTS 3,628,064 12/1971 Camenzind et al. .................... 257/369

*Primary Examiner*—Carl W. Whitehead

*Attorney, Agent, or Firm*—Adams & Wilks

[57] ABSTRACT

To obtain an extremely small constant current with high accuracy, a constant current circuit comprises a first constant-current source for producing a first constant current, a second constant-current source connected to the first constant-current source for producing a second constant current having a different value from that of the first current, and an output terminal from which a third constant current equal to the difference between the first and second constant currents is output, such that the third constant current having an extremely small value may be produced without the use of a constant current source capable of producing an extremely small constant current value. The first and second constant current sources may be connected in series with the output terminal connected therebetween, or in parallel through a current mirror circuit. In addition, the constant current circuit can be provided in a timer circuit to produce a very long constant time signal with great stability. In one embodiment, such a timer circuit further includes a capacitor connected to the output terminal for receiving the third constant current and accumulating charge, a reference voltage generator for producing a reference voltage, and a voltage comparator for comparing the voltage of the capacitor with the reference voltage.

32 Claims, 8 Drawing Sheets

SEMICONDUCTOR INTEGRATED CIRCUIT DEVICE FOR OBTAINING EXTREMELY SMALL CONSTANT CURRENT AND TIMER CIRCUIT USING CONSTANT CURRENT CIRCUIT

BACKGROUND OF THE INVENTION

This invention relates a constant-current circuit which is made up of a semiconductor device, and more particularly to a semiconductor integrated circuit device that mounts thereon a constant-current circuit which is capable of obtaining an extremely small constant current with high accuracy and stability. Also, this invention relates to a timer circuit which is made up of a semiconductor device, and more particularly to a semiconductor integrated circuit device that mounts thereon a timer circuit which is capable of obtaining a very long constant time signal with high accuracy and stability at low costs.

Up to now, for example, in the case where a constant-current circuit is formed of a MIS(MOS)FET, and charges are accommodated in a capacitor, using a constant current value which is determined by that constant-current circuit, a circuit shown in FIG. 11(*a*) was used.

It should be noted that, in this specification, a description will be given of an example of a MOSFET in which an insulating layer interposed between a metal gate electrode and a semiconductor substrate is formed of a silicon oxide film as a typical example of a MISFET.

Two p-type MOSFETs 807 and 808 constitute a current mirror circuit 803, and the p-type MOSFET 807 is connected with an n-type MOSFET 801 whereas the p-type MOSFET 808 is connected with a capacitor 802 for accommodating charges therein.

The n-type MOSFET 801 acts as a constant-current device because a constant bias voltage is applied to a gate of the n-type MOSFET 801.

Hence, a constant current determined by the n-type MOSFET 801 allows the capacitor 802 to be accommodated with charges.

Also, FIG. 11(*b*) shows an example in which the constant-current circuit and the capacitor shown in FIG. 11(*a*) are connected with a voltage comparator circuit and a reference voltage generator circuit. In the example, charges starts to be accommodated in the capacitor 802 simultaneously when a reset signal becomes "L", and a reference voltage generated by a reference voltage generator circuit 804 and a voltage between terminals of the capacitor 802 are compared with each other by a voltage comparator circuit 805, thereby being capable of obtaining a constant time signal.

However, in the case where the charges are accommodated in the capacitor using an extremely small constant current (for example, 1 nA or less) in FIG. 11(*a*), in other words, in the case where a try is taken to obtain a very long time signal (for example, appropriately 1 sec), the conductance of the semiconductor device that makes up of the constant-current source in FIG. 11(*a*) needs to be extremely reduced, which leads to such a problem that its current value per se becomes largely unstable because it is adversely affected by a leak current, etc.

Moreover, in the case where the constant-current source is made up of a MOSFET, and a try is taken to obtain a constant current using a channel current of the MOSFET, there is required that the channel width of the MOSFET is set to a minimum machining dimension, and the channel length is also remarkably lengthened, or that the capacitor for accommodating charges therein is remarkably increased in scale.

For example, in FIG. 11(*b*), a time signal T is represented by an expression (1) stated below.

$$T=(C\cdot V_{ref})/T_{const} \quad (1)$$

where, C is an-electrostatic capacity of the capacitor 802 for accommodating charges therein, $V_{ref}$ is an output voltage of the reference voltage generator circuit 804, and $I_{const}$ is a channel current value of the n-type MOSFET 801 that acts as a constant-current device.

Hence, in the case where the capacity of the capacitor 802 is 100 pF and the output voltage of the reference voltage generator circuit 804 is 1 V, when a try is taken to obtain 1 sec as a time signal, $1_{const}$ obtained by deforming the expression (1) becomes 100 pA.

If the channel current of the MOSFET is used to obtain the time signal T, the size becomes largely increased, and the time signal T is also adversely affected by a leak current, etc. Thus, the time signal T is difficult to obtain from the stability of current.

Also, it is possible that the time signal obtained by the circuit shown in FIG. 11(*b*) is kept short, and it is divided to obtain a long time signal. However, this requires a circuit for generating a repeat signal and a divider circuit, resulting in a large-scaled circuit.

Hence, in the conventional semiconductor integrated circuit device shown in FIGS. 11(*a*) and 11(*b*), it is rather idealistic to accommodate charges in the capacitor using a constant current or to obtain a very long time signal, thereby causing the costs to extremely increase.

SUMMARY OF THE INVENTION

In order to solve the above-mentioned problems, this invention provides the following means.

As first means, a constant-current circuit including a first constant-current source that enables a first constant current to flow being connected in series to a second constant-current source that enables a second constant current having a value different from that of the first constant current to flow, and outputting a third constant current which is determined by a difference between the first constant current and the second constant current is formed of a semiconductor device.

As second means, the constant-current circuit as recited in the first means, where the first constant-current source and the second constant-current source are connected in parallel with each other through a current mirror circuit, the current mirror circuit is made up of two semiconductor devices having at least one control terminal and two main electrode terminals that allows a current value flowing from the control terminal to be controlled, the control terminals of the two semiconductor devices are commonly connected to each other, one of the main electrode terminals of the respective two main electrode terminals are commonly connected to each other, the other main electrode terminals are connected to the first constant current source and the second constant current source, respectively, and a current flowing from a node of the second constant-current source and the current mirror circuit or a current flowing into the node forms a third constant current, is formed of a semiconductor device.

As third means, in the constant-current circuit as recited in the first and second means, the constant-current circuit is formed of a MOSFET, the first constant-current source and said second constant-current source are formed of depletion type MISFETs, and gate electrodes of the depletion type MISFETs are potentially identically biased to the respective source electrodes thereof.

As fourth means, in the constant-current circuit as recited in the second means, the constant-current circuit is formed of a MOSFET, the first constant-current source and said second constant-current source are formed of enhancement type MOSFETS, and a constant voltage is applied to their gate electrodes to control a current value.

As fifth means, in the constant-current circuit as recited in the second to fourth means, the first constant-current source and said second constant-current source are formed of MISFETs having a plurality of channel regions having different impurity concentrations planarly.

As sixth means, in the constant-current circuit as recited in the fifth means, the first constant-current source and the second constant-current source are formed of MISFETs having a physical channel length and channel width being identical to each other, and the distribution of the impurity concentrations in the channel region being different from each other.

As seventh means, a timer circuit in which a constant-current circuit is connected with a capacitor for charge accommodation, a reference voltage generator circuit and a voltage comparator circuit, charges are accommodated in the capacitor using a constant current determined by the constant-current circuit, and a terminal voltage of the capacitor is compared with a reference voltage generated by the reference voltage generator circuit by the voltage comparator circuit, to thereby generate a constant time signal.

As eighth means, in a timer circuit including a constant-current circuit in which a first constant-current source that enables a constant current to flow and a second constant-current source that enables a constant current having a value different from that of the current flowing in the first constant-current source to flow is connected to each other through a current mirror circuit, the constant-current circuit having a node of the second constant-current source and the current mirror circuit as an output terminal, a capacitor for charge accommodation and a voltage comparator circuit that compares the reference voltage with the terminal voltage of the capacitor to output an output signal are connected to the output terminal of the constant-current circuit, wherein a timer reset MISFET is provided at the output terminal of said constant-current circuit, and a junction diode having the same area as the drain junction area of the timer reset MISFET is connected to a node of the first constant-current source and the current mirror circuit.

As ninth means, in the timer circuit as recited in the eighth means, the timer reset MISFET is provided at the output terminal of the constant-current circuit, and MISFET which is identical in physical channel length and channel width to the timer reset MISFET and is in an off-state when the timer is operative is connected to the node of the first constant-current source and the current mirror circuit.

DETAILED DESCRIPTION

Figure 1:
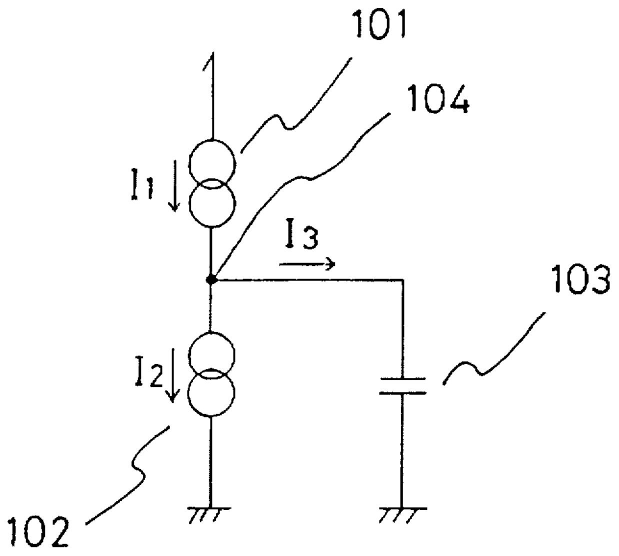
FIG. 1 is a block diagram showing a constant-current circuit in accordance with a first embodiment of the present invention.

Hereinafter, a description will be given of embodiments of this invention with reference to the accompanying drawings FIG. 1 is a block diagram showing a constant-current circuit in accordance with a first embodiment of the present invention.

A first constant-current source 101 is connected in series to a second constant-current source 102 between a supply voltage and an earth potential.

A current $I_1$ flowing in the first constant-current source 101 and a current $I_2$ flowing in the second constant-current source 102 are set to be slightly different from each other, and in this example, if a relationship of $I_1>I_2$ is satisfied, then charges are accommodated in a capacitor 103 using a constant current $I_3$ which is representative of a difference between $I_1$ and $I_2$.

Also, if a relationship of $I_1<I_2$ is satisfied, then the charges which has been accommodated in the capacitor 103 in advance is drawn out using the constant current $I_3$ which is representative of a difference between $I_1$ and $I_2$. Hence, even though the constant current used for accommodating the charges in the capacitor 103 or drawing out the charges from the capacitor 103 is very small, the current flowing in the constant-current sources 101 and 102 may not be so small, thereby being capable of obtaining a constant current which is relatively stabilized.

Figure 2:
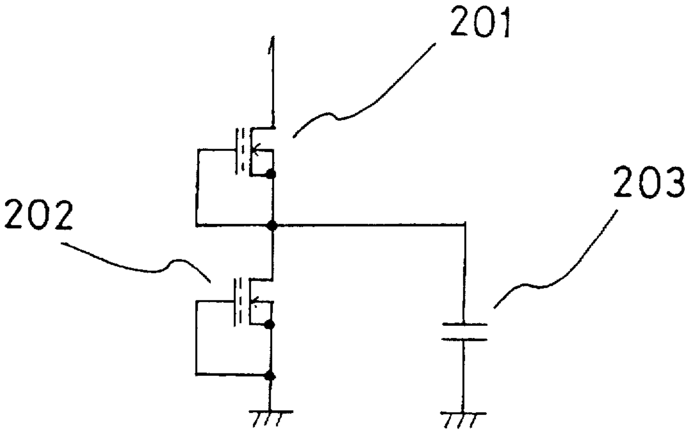
FIG. 2 is a block diagram showing a specific constant-current circuit in accordance with a second embodiment of the present invention.

FIG. 2 shows a circuit diagram in accordance with a second embodiment of the present invention, which is a specific circuit in the event of using a MOSFET as the constant-current source in the first embodiment.

In this embodiment, n-type MOSFETs 201 and 202 of the depletion type are used for the constant-current sources and connected to each other in such a manner that the gate and source electrodes of one MOSFET are potentially identical to those of the other, respectively. Also, the respective substrates are electrically isolated from each other so as to ignore the fluctuation of a threshold voltage due to the substrate effect and potentially identical to the respective source electrodes. It should be noted that, if the fluctuation of the channel current due to the substrate effect is accurately estimated so that the size of the MOSFET can be selected, it is unnecessary to isolate the substrates of the n-type MOSFETs 201 and 202 from each other, thereby being capable of reducing an area of the substrate.

For example, in the prior art, in the case where charges are accommodated in the capacitor by a constant-current source using a MOSFET with a constant current of 100 pA, the channel current of the MOSFET that forms the constant-current source must be limited to 100 pA, the channel length of the MOSFET is largely lengthened, and a region which is liable to be adversely affected by a leak current must be used. On the other hand, according to this embodiment, if the channel current $I_1$ of the n-type MOSFET 201 that forms the first constant-current source is set to, for example, 10.1 nA, and the channel current $I_2$ of the n-type MOSFET 202 that forms the second constant-current source is set to 10.0 nA, then the charges to be accommodated in the capacitor 203 is accommodated using the constant current $I_3$ of 100 pA which is representative of a difference between the channel current $I_1$ and the channel current $I_2$.

In other words, because a relatively large current value can be taken as the channel current of the MOSFET, the device of this embodiment is excellent in stability.

In fact, there are some proposals of the methods of making a difference between the channel currents of the MOSFETs that form two constant-current sources, for example, if the channel length of the MOSFET is changed 1%, a difference between the respective constant-current values can be produced as described above.

Moreover, in the second embodiment of FIG. 2, the MOSFET of the depletion type forms the constant-current source. However, in the case where a constant voltage is applied to the gate of the enhancement type MOSFET to form the constant-current source, in the prior art, an extremely small current flowing in a sub-threshold region or a region close to the sub-threshold region is used for the channel current, thereby being incapable of ignoring the influence of the leak current. Therefore, a structure using a difference between two constant-current sources as in this embodiment is very effective from the viewpoints of the size of the MOSFET and the stability of a current.

In FIG. 2, the n-type MOSET is used as the constant-current source. The same effect is obtained by using the p-type MOSFET.

Figure 3:
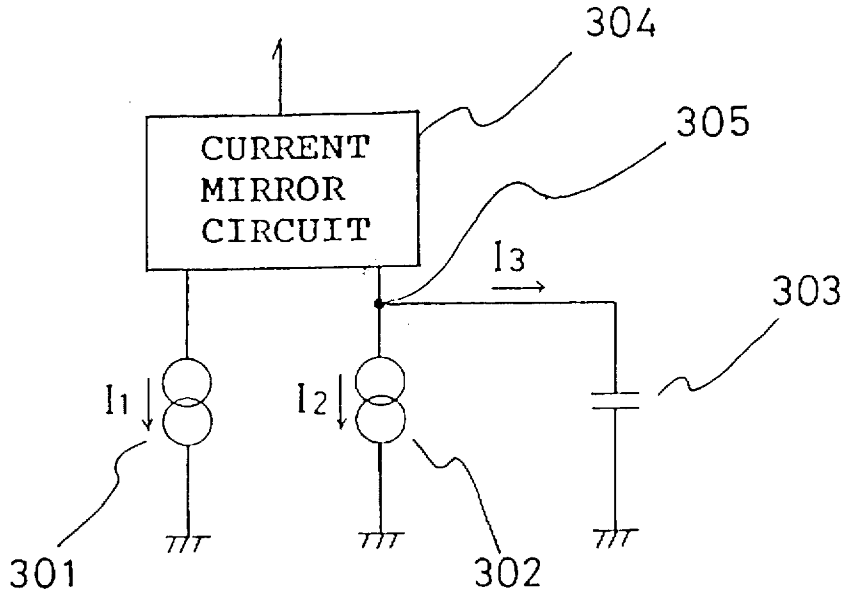
FIG. 3 is a block diagram showing a constant-current circuit in accordance with a third embodiment of the present invention.

FIG. 3 is a block diagram showing a constant-current circuit in accordance with a third embodiment of the present invention.

A first constant-current source 301 is connected in parallel with a second constant-current source 302 through a current mirror circuit 304 between a supply voltage and an earth potential.

A current $I_1$ flowing in the first constant-current source 301 and a current $I_2$ flowing in the second constant-current source 302 are set to be slightly different from each other, and in this example, if a relationship of $I_1>I_2$ is satisfied, then charges are accommodated in a capacitor 303 using a constant current $I_3$ which is representative of a difference between $I_1$ and $I_2$.

Also, if a relationship of $I_1<I_2$ is satisfied, then the charges which has been accommodated in the capacitor 303 in advance is drawn out using the constant current $I_3$ which is representative of a difference between $I_1$ and $I_2$.

Hence, even though the constant current used for accommodating the charges in the capacitor 303 or drawing out the charges from the capacitor 303 is very small, the current flowing in the constant-current sources 301 and 302 may not be so small, thereby being capable of obtaining a constant current which is relatively stabilized.

Figure 4:
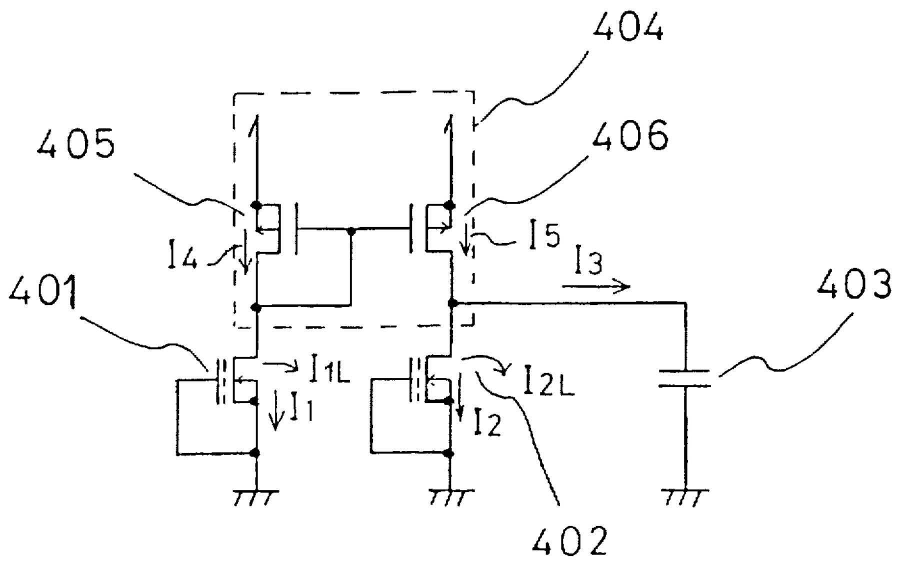
FIG. 4 is a block diagram showing a specific constant-current circuit in accordance with a fourth embodiment of the present invention.

FIG. 4 shows a circuit diagram in accordance with a fourth embodiment of the present invention, which is a specific circuit in the event of using a MOSFET as the constant-current source in the third embodiment.

In this embodiment, n-type MOSFETs 401 and 402 of the depletion type are used for the constant-current sources and connected to each other in such a manner that the gate and source electrodes of one MOSFET are potentially identical to those of the other, respectively.

Also, a current mirror circuit 404 is made up of p-type MOSFETs 405 and 406, and the respective gate electrodes thereof are commonly connected to each other and also connected to a drain electrode of the p-type MOSFET 405.

A drain electrode of the n-type MOSFET 401 is connected to the drain electrode of the p-type MOSFET 405 that forms the current mirror circuit 404, and the drain electrode of the n-type MOSFET 402 is connected to the drain electrode of the p-type MOSFET 406 that forms the current mirror circuit 404, similarly.

Likely to the second embodiment, in this embodiment, if the channel current $I_1$ of the n-type MOSFET 401 that forms the first constant-current source is set to, for example, 10.1 nA, and the channel current $I_2$ of the n-type MOSFET 402 that forms the second constant-current source is set to 10.0 nA, then the charges to be accommodated in the capacitor 403 is accommodated using the constant current $I_3$ of 100 pA which is representative of a difference between the channel current $I_1$ and the channel current $I_2$.

In other words, because a relatively large current value can be taken as the channel current of the MOSFET, the device of this embodiment is excellent in stability.

In fact, there are some proposals of the methods of making a difference between the channel currents of the MOSFETs that form two constant-current sources, for example, if the channel length of the MOSFET is changed 1%, a difference between the respective constant-current values can be produced as described above.

Figure 5:
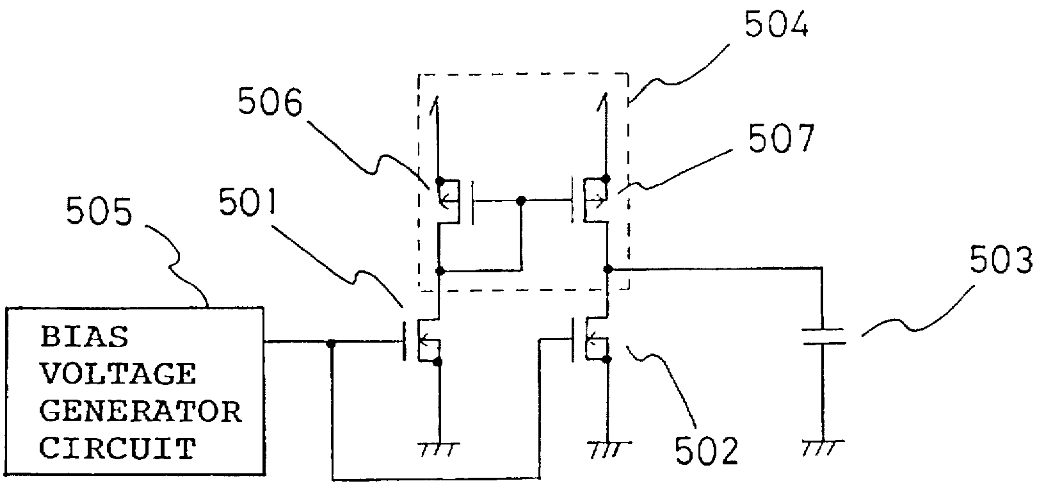
FIG. 5 is a block diagram showing a specific constant-current circuit in accordance with a fifth embodiment of the present invention.

FIG. 5 shows a circuit diagram in accordance with a fifth embodiment of this embodiment, which is another specific circuit diagram in the event of using a MOSFET as the constant-current source in the third embodiment.

In the fourth embodiment, the n-type MOSFET of the depletion type is used as the constant-current source. However, in this embodiment, n-type MOSFETs 501 and 502 of the enhancement type are used to bias its gate electrode by a constant voltage generated in a bias voltage generator circuit 505, thereby obtaining a constant-current characteristic.

With the above structure, in case of setting the channel current of the n-type MOSFETs 501 and 502 to a desired value, because it is available as means for setting the gate voltage in addition to the channel width and channel length of the MOSFET, the degree of free is large.

In the fifth embodiment shown in FIG. 5, the n-type MOSFET is used as a constant-current source and the p-type MOSFET is used as the current mirror circuit. Even though the p-type MOSFET and the n-type MOSFET are used conversely, the same effect can be obtained.

Figure 6B:
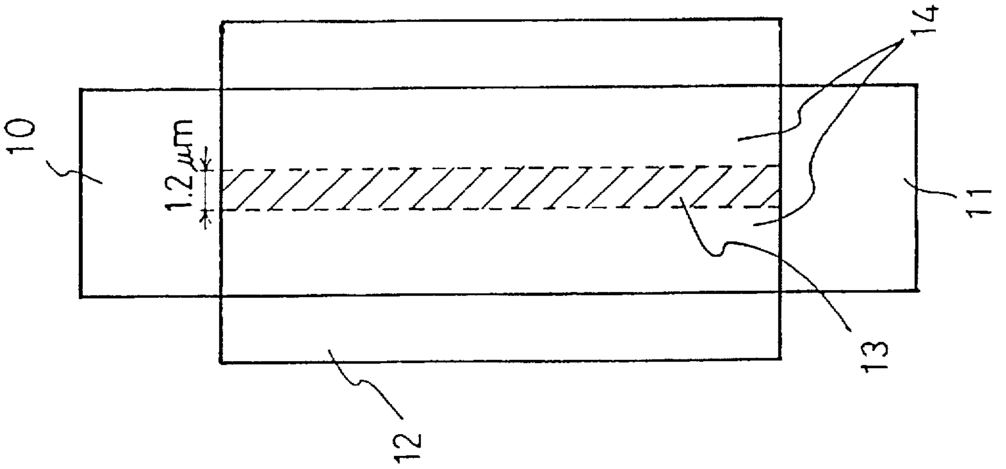
FIGS. 6(*a*) and 6(*b*) are schematic plan views showing a MISFET in accordance with a sixth embodiment of the present invention.
Figure 6A:
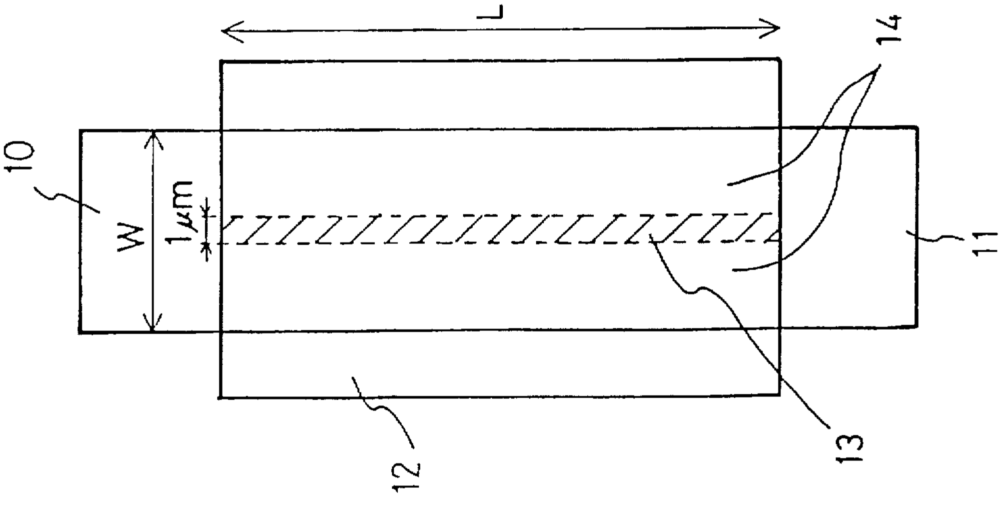

FIG. 6 shows a schematic plan view of a MISFET in accordance with a sixth embodiment of the present invention, in which a channel region is formed between a drain region 10 and a source region 11, and a gate electrode 12 is formed on a channel region through a gate insulating film (omitted in FIG. 6). The channel region has a plurality of channel regions having different impurity concentrations.

In FIG. 6, there is shown a case in which the channel region is comprised of a channel region 13 of a first impurity concentration and a channel region 14 of a second impurity concentration. FIG. 6(*a*) shows a case in which the channel region 13 of the first impurity concentration is 1 μm in width whereas FIG. 6(*b*) shows a case in which the channel region 13 of the first impurity concentration is 1.2 μm in width. In this example, when the physical channel length L and channel width W of the MISFET are identical to each other, the channel current amount can be controlled by an area ratio of the channel region 13 of the first impurity concentration to the channel region 14 of the second impurity concentration.

With the use of the MISFET having the structure shown in FIG. 6 as two constant-current sources in the second, third and fifth embodiments, a difference in channel current can be readily produced.

In general, in the case where a circuit operative by a very small current is formed of the MISFET, care must be given to the leak current in a junction region such as a drain and the leak current in the channel region. The influence of the leak current will be described with reference to the circuit shown in FIG. 4 as an example.

In FIG. 4, reference symbols $I_1$, $I_3$, $I_4$ and $I_5$ represent the channel currents of the MOSFETs 401, 402, 405 and 406, respectively, $I_{1L}$ and $I_{2L}$ represent leak currents in the junction region and the channel region of the MOSFETs 401 and 402, respectively, and $I_3$ represents an output current. An output current $I_3$ is obtained by the following expression.

$$\begin{aligned} I_4 &= I_5 = I_1 + I_{1L} \\ I_3 &= I_5 - (I_2 + I_{2L}) \\ &= (I_1 + I_{1L}) - (I_2 + I_{2L}) \\ &= I_1 - I_2 + I_{1L} - I_{2L} \\ &= I_1 - I_2 + \Delta I_L \end{aligned}$$

where $\Delta I_L = I_{1L} - I_{2L}$, that is, a difference in leak current between the MOSFETs 401 and 402 adversely affects the output current $I_3$. Also, in this example, since the MOSFETs 405 and 406 are usually so designed that the physical channel length and channel width become identical to each other, it is assumed that the leak current is also identical. With the MOSFETS 401 and 402 being formed of the MISFET structured as in FIG. 6, the physical channel length and channel width can be identical to each other, the leak currents are offset so that the output current $I_3$ can be determined by only a difference between currents of two constant-current sources.

Hence, as a result that the MISFET having the structure shown in FIG. 6 is used as two constant-current sources in the second, third and fifth embodiments, not only a difference in channel current can easily be produced, but also the leak current can be offset, thereby being capable of obtaining a very small constant-current circuit which is largely stabilized and excellent in accuracy.

Figure 7:
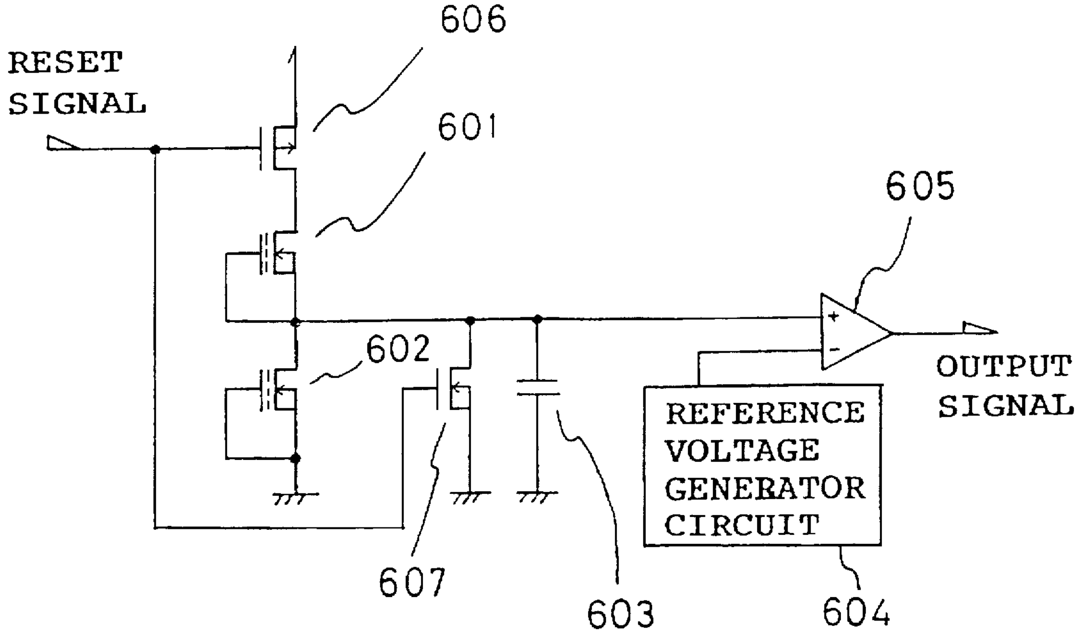
FIG. 7 is a block diagram showing a timer circuit in accordance with a seventh embodiment of the present invention.

FIG. 7 shows a circuit diagram in accordance with a seventh embodiment of the present invention, which is a block diagram showing a timer circuit capable of producing a time signal by connecting a reference voltage generator circuit 604 and a voltage comparator circuit 605 to the constant-current circuit in the second embodiment.

Simultaneously when a reset signal is changed from "H" to "L", charges are accommodated in a capacitor 603 using a constant current which is representative of a difference in channel current between the n-type MOSFETs 601 and 602 that form constant-current sources. It should be noted that the channel current of the n-type MOSFET 601 is set to be slightly larger than that of the n-type MOSFET 602.

A voltage comparator circuit 605 compares a terminal voltage of the capacitor 603 with a reference voltage developed by a reference voltage generator circuit 604 and outputs an output signal when those voltages become identical to each other.

When a time signal is to be outputted again, the reset signal is set to "H" so that the charges accommodated in the capacitor 603 are discharged by the n-type MOSFET 607, and then the reset signal is set to "L" again, thereby operating the timer circuit again.

Figure 8:
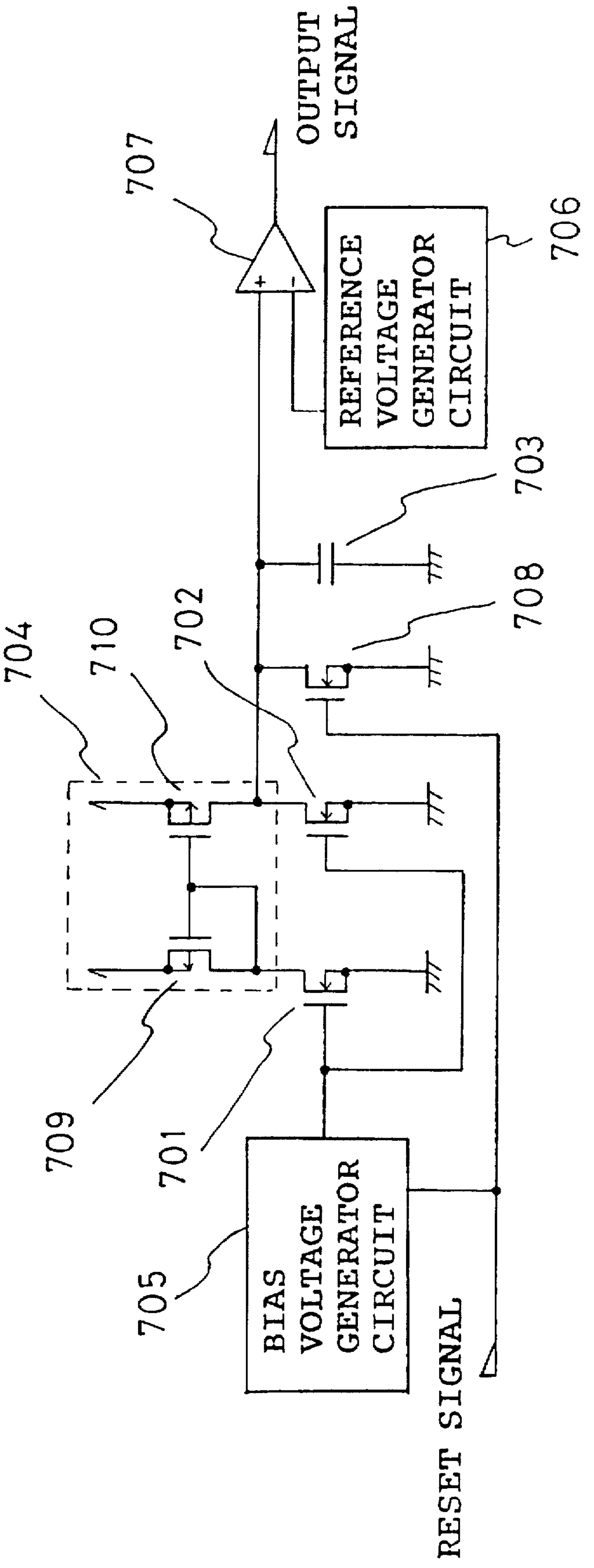
FIG. 8 is a block diagram showing a timer circuit in accordance with an eighth embodiment of the present invention.

FIG. 8 shows a circuit diagram in accordance with an eighth embodiment of the present invention, which is a block diagram showing another timer circuit capable of producing a time signal by connecting a reference voltage generator circuit 706 and a voltage comparator circuit 707 to the constant-current circuit in the fifth embodiment.

As in the seventh embodiment, simultaneously when a reset signal is changed from "H" to "L", charges are accommodated in a capacitor 703 using a constant current which is representative of a difference in channel current between the n-type MOSFETs 701 and 702 that form constant-current sources. It should be noted that the channel current of the n-type MOSFET 701 is set to be slightly larger than that of the n-type MOSFET 702.

A voltage comparator circuit 707 compares a terminal voltage of the capacitor 703 with a reference voltage developed by a reference voltage generator circuit 706 and outputs an output signal when those voltages become identical to each other.

When a time signal is to be outputted again, the reset signal is set to "H" so that the charges accommodated in the capacitor 703 are discharged by the n-type MOSFET 708, and then the reset signal is set to "L" again, thereby operating the timer circuit again. In this situation, the bias voltage generator circuit outputs an "L" level when it is in a reset state in accordance with a reset signal to cut off the channel currents of the n-type MOSFETs 701 and 702.

Also, if a voltage generated by the bias voltage generator circuit 705 can be made identical to a voltage generated by the reference voltage generator circuit 706, these two constant-voltage generator circuits are commonly used as one circuit.

In the present invention, a description was given with reference to the insulated gate type field effect transistor represented by the MOSFET as an example. The same effect can be obtained even though the above-mentioned constant-current source and current mirror circuit are formed of a junction FET and a bipolar transistor.

Figure 9:
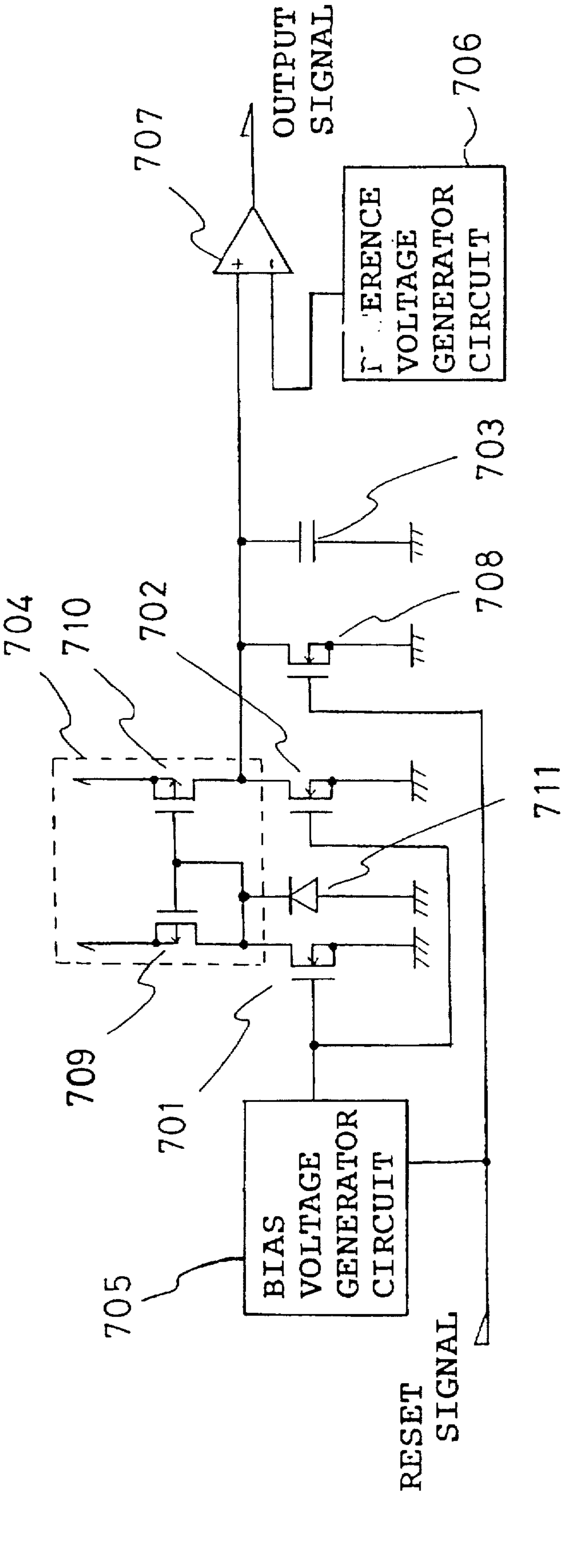
FIG. 9 is a block diagram showing a timer circuit in accordance with a ninth embodiment of the present invention.

FIG. 9 shows a circuit diagram in accordance with a ninth embodiment of the present invention, which is a block diagram showing another specific timer circuit capable of producing a time signal by connecting a cathode side of a junction diode 711 to a node of the n-type MOSFET 701 that forms the first constant-current source and the current mirror circuit 704 of the timer circuit in the eighth embodiment, and an anode side of the junction diode 711 is grounded.

As in the eighth embodiment, simultaneously when the reset signal is changed from "H" to "L", charges are accommodated in the capacitor 703 using a constant current which is representative of a difference in channel current between the n-type MOSFETS 701 and 702 that form constant-current sources. In this example, a leak current always occurs in the drain junction region of the reset n-type MOSFET 708 although it is slight. For example, if the leak current is 1 pA and a constant-current value which is representative of a difference in channel current between the n-type MOSFETs 701 and 702 is 100 pA, then the leak current adversely affects the constant current by 1%. It is needless to say that the influence of the leak current becomes larger as the constant current value is made very small, and in the circuit requiring accuracy, the leak current cannot be ignored. In view of this, in the ninth embodiment, the junction diode 711 having the same area as the drain junction region of the reset n-type MOSFET 708 is connected in parallel with the n-type MOSFET 701 that forms the first constant-current source. With such a structure, a current having the same quantity of a current leaked in the drain junction region of the reset n-type MOSFET 708 added to the first constant current is inputted to the current mirror circuit 704 so that the leak current is added to the output current from the constant-current circuit in advance, whereby the leak current is offset, and charges can be accommodated in the capacitor 703 using a constant current which is representative of a difference in channel current between the n-type MOSFETs 701 and 702. With such a structure, a timer circuit can be realized which has a long constant time signal which is higher in accuracy and stabilized.

Figure 10:
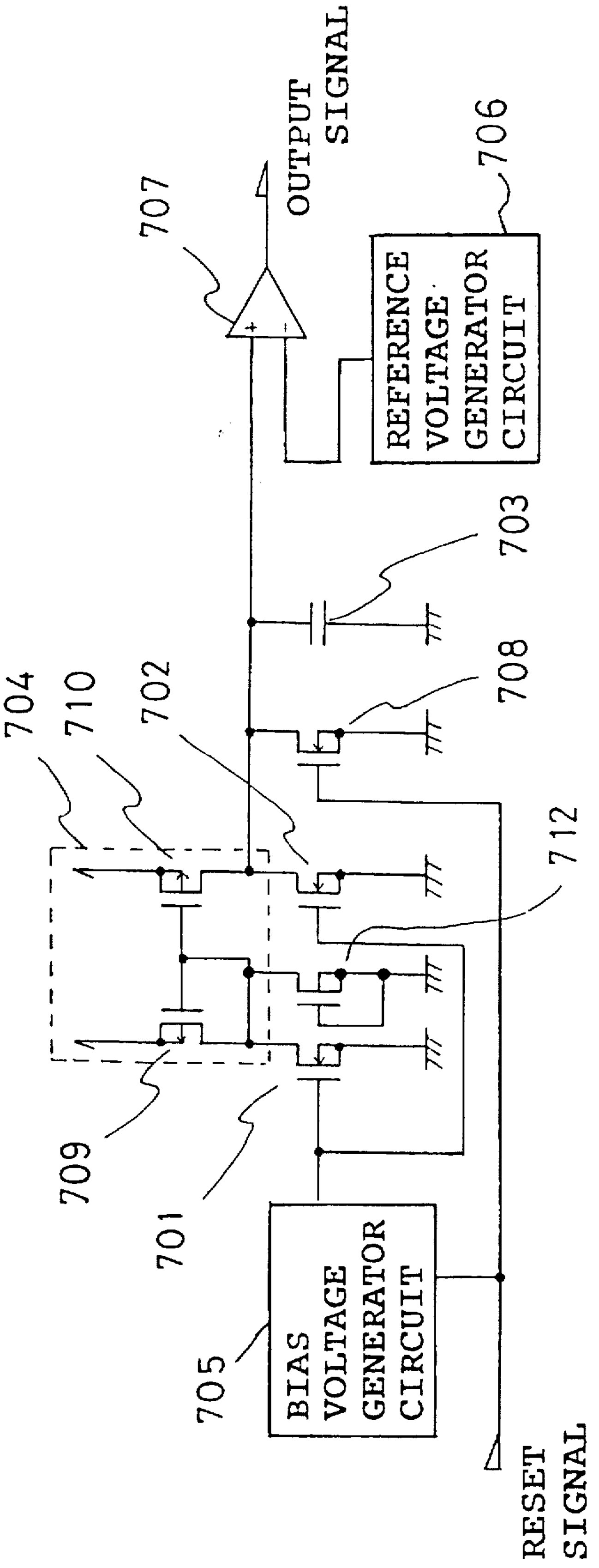
FIG. 10 is a block diagram showing a timer circuit in accordance with a tenth embodiment of the present invention.
Figure 11A:
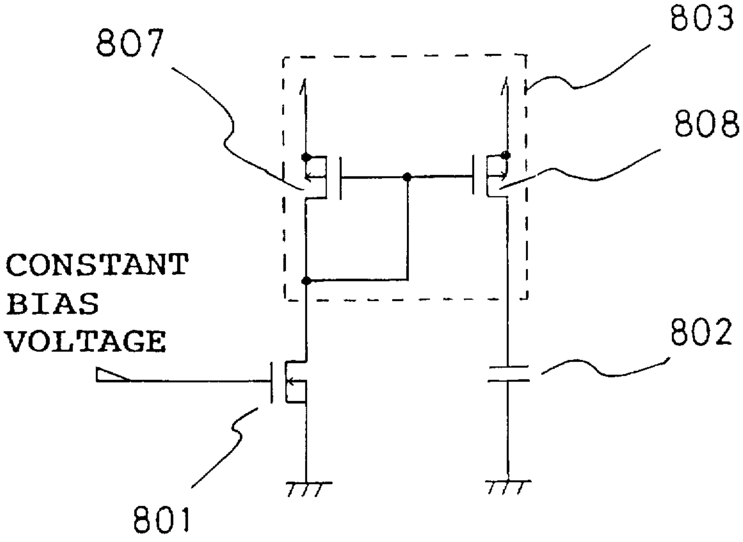
F I G. 1 1A PRIOR ART
FIG. 11(*a*) is a circuit diagram showing a constant-current circuit and FIG. 11(*b*) is a block diagram showing a timer circuit in a prior art.
Figure 11B:
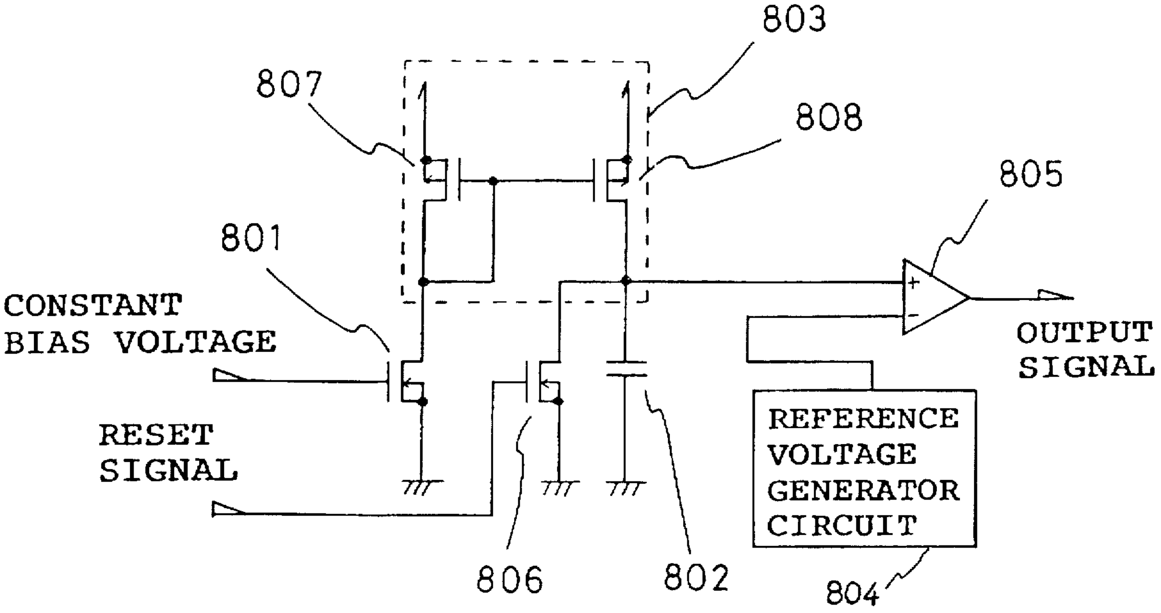
F I G. 1 1B PRIOR ART

FIG. 10 is a circuit diagram in accordance with a tenth embodiment of the present invention, which is a block diagram showing a still another specific timer circuits where an m-type MOSFET 712 is connected instead of the junction diode 711 in the timer circuit of the ninth embodiment, and the gate and source of the n-type MOSFET 712 are grounded. As in the ninth embodiment, the n-type MOSFET 712 is connected in parallel with the n-type MOSFET 701 that forms the first constant-current source, thereby being capable of obtaining a constant-current circuit that offsets the leak current. A difference between the ninth embodiment and the tenth embodiment is that the leak current which can be offset in the ninth embodiment is only a leak current in the drain junction region of the n-type MOSFET 708 whereas the leak current which can be offset in the tenth embodiment is not only the leak current in the drain junction region of the n-type MOSFET 708 is off but also the physical channel length and channel width of the same n-type MOSFETs 708 and 712 are preferably identical to each other. Moreover, it is preferable that the area of the drain junction region is similarly identical.

With such a structure, a timer circuit which has a long constant time signal which is higher in accuracy and more stabilized than the ninth embodiment.

According to this invention, in a constant-current circuit having a first constant-current source that allows a first constant current to flow and a second constant-current source that allows a second constant current to flow, a difference between the first constant current and the second constant current is representative of the third constant current, thereby being capable of obtaining a very small constant current with high accuracy and stability.

Also, said constant-current circuit is used in the timer circuit for generating a constant time signal, thereby being capable of realizing a semiconductor integrated circuit device mounting thereon the timer circuit which is particularly capable of obtaining a very long constant time signal with a high accuracy and stability at low costs.

What is claimed is:

1. A semiconductor integrated circuit device having a constant-current circuit comprising: a first constant-current source for producing a first constant current; a second constant-current source connected to the first constant-current source for producing a second constant current having a value different from that of the first current; and an output terminal connected to at least one of the first and second constant-current sources from which a third constant current equal to the difference between the first and second constant currents is output.

2. A semiconductor integrated circuit device as claimed in claim 1; further comprising a current mirror circuit; the first constant-current source and the second constant-current source are connected in parallel with each other through the current mirror circuit, and the current mirror circuit comprises two semiconductor devices each having at least one control terminal and two main electrode terminals, the control terminals of the two semiconductor devices are commonly connected to each other, one of the main electrode terminals of each semiconductor device are commonly connected to each other, the other main electrode terminal of one semiconductor device is connected to the first constant current source and the other main electrode terminal of the other semiconductor device is connected to the second constant current source, and the output terminal is provided at a node of the second constant-current source and the current mirror circuit.

3. A semiconductor integrated circuit device as claimed in claim 1 or 2; wherein the first constant-current source and the second constant-current source comprise depletion type MISFETs, and gate electrodes of the depletion type MISFETs are tied to the same potential as the respective source electrodes thereof.

4. A semiconductor integrated circuit device as claimed in claim 2; wherein the first constant-current source and the second constant-current source comprise enhancement type MISFETs, and respective gate electrodes of the enhancement type MISFETs have a constant voltage applied thereto to control the value of the first and second constant currents.

5. A semiconductor integrated circuit device as claimed in claim 1 or 2; wherein the first constant-current source and the second constant-current source each comprise a MISFET having a channel provided with a plurality of impurity regions each having a different impurity concentration such that the first and second constant currents differ in value.

6. A semiconductor integrated circuit device as claimed in claim 5; wherein the MISFETs that form the first constant-current source and the second constant-current source each have the same channel length and channel width and have a different impurity concentration distribution such that the first and second constant currents differ in value.

7. A semiconductor integrated circuit device having a timer circuit incorporating a constant-current circuit, the timer circuit comprising: a first constant-current source for producing a first constant current; a second constant-current source connected to the first constant-current source for producing a second constant current having a value different from that of the first constant current; a capacitor for charge accumulation connected to at least one of the first and second constant-current circuits for receiving a third constant current equal to the difference between the first and second constant currents; and a voltage comparator circuit for comparing a reference voltage with a terminal voltage of the capacitor and producing an output signal when the terminal voltage of the capacitor is equal to the reference voltage.

8. A semiconductor integrated circuit device as claimed in claim 7; further comprising a current mirror circuit connected to the first constant-current source and the second constant-current sources an output terminal connected to the capacitor and to a node of the second constant-current source and the current mirror circuits a timer reset MISFET connected to the output terminal for allowing the capacitor to discharge therethrough in response to application of an external reset signal; and a semiconductor device connected to a node of the first constant-current source and the current mirror circuit for offsetting a leakage current of the timer reset MISFET.

9. A semiconductor integrated circuit device as claimed in claim 8; wherein the semiconductor device comprises a MISFET which is identical in physical channel length and channel width to the timer reset MISFET and is in a normally off-state when the timer is operative and is connected to a node of the first constant-current source and the current mirror circuit.

10. A semiconductor integrated circuit device as claimed in claim 1; wherein the first constant-current source and the second constant-current source are connected in series and the output terminal is connected therebetween.

11. A semiconductor integrated circuit device as claimed in claim 1; further comprising a capacitor connected to the output terminal for accumulating charge in accordance with the third constant current.

12. A semiconductor integrated circuit device as claimed in claim 1; wherein the first and second constant-current sources comprise transistors having the same channel dimensions but having a different channel impurity concentration distribution such that the first and second constant currents differ by a desired amount.

13. A semiconductor integrated circuit device as claimed in claim 1; wherein the first and second constant currents vary slightly and the third constant current is equal to the slight difference between the first and second constant-currents, such that the third constant current having an extremely small value may be produced without the need for use of a constant-current source capable of producing an extremely, small const ant current value.

14. A semiconductor integrated circuit device as claimed in claim 13; wherein the first and second constant-current sources comprise transistors having the same channel dimensions but having a different channel impurity concentration distribution such that the first and second constant currents differ slightly.

15. A semiconductor integrated circuit device as claimed in claim 1; further comprising a current mirror circuit; wherein the first and second constant-current sources are connected in parallel through the current mirror circuit.

16. A semiconductor integrated circuit device as claimed in claim 8; wherein the semiconductor device comprises a junction diode having the same area as the drain junction area of the timer reset MISFET and is connected to a node of the first constant-current source and the current mirror circuit for offsetting a drain leakage current in the timer reset MISFET.

17. A semiconductor integrated circuit device having a constant-current circuit comprising: a plurality of constant-current sources each for producing a different individual constant current; an output terminal connected to the plurality of constant-current sources such that a combined constant current having a value equal to the difference of the individual constant currents is produced at the output terminal.

18. A semiconductor integrated circuit device according to claim 17; further comprising a capacitor connected to the output terminal for accumulating charge in accordance with the combined constant current.

19. A semiconductor integrated circuit device according to claim 17; wherein the plurality of constant-current sources comprise transistors each having the same channel dimensions and having a different channel impurity concentration distribution such that the first and second constant currents differ by a desired amount.

20. A semiconductor integrated circuit device according to claim 17; further comprising a current mirror circuit; wherein the plurality constant-current sources are connected in parallel through the current mirror circuit.

21. A semiconductor integrated circuit device having a constant-current circuit comprising: a first constant-current source for producing a first constant current; a second constant-current source connected to the first constant-current source for producing a second constant current having a value slightly different from that of the first current; and an output terminal connected to at least one of the first and second constant-current sources from which a third constant current equal to the slight difference between the first and second constant currents is output, such that the third constant current having an extremely small value may be produced without the need for use of a constant-current source capable of producing an extremely small constant current value.

22. A semiconductor integrated circuit device according to claim 21; wherein the first constant-current source and the second constant-current source are connected in series and the output terminal is connected therebetween.

23. A semiconductor integrated circuit device according to claim 21; further comprising a current mirror circuit; wherein the first constant-current source and the second constant-current source are connected in parallel with each other through the current mirror circuit.

24. A semiconductor integrated circuit device according to claim 23; wherein the current mirror circuit comprises two semiconductor devices each having at least one control terminal and two main electrode terminals, the control terminals of the two semiconductor devices are commonly connected to each other, one of the main electrode terminals of each semiconductor device are commonly connected to each other, the other main electrode terminal of one semiconductor device is connected to the first constant current source and the other main electrode terminal of the other semiconductor device is connected to the second constant current source, and the output terminal is provided at a node of the constant-current source and the current mirror circuit.

25. A semiconductor integrated circuit device according to claim 21; wherein the first constant-current source and the second constant-current source comprise depletion type MISFETs.

26. A semiconductor integrated circuit device according to claim 25; wherein gate electrodes of the depletion type MISFETs are tied to the same potential as the respective source electrodes thereof.

27. A semiconductor integrated circuit device according to claim 21; wherein the first constant-current source and the second constant-current source comprise enhancement type MISFETs, and gate electrodes of the enhancement type MISFETs have a constant voltage applied thereto to control the value of the first and second constant currents.

28. A semiconductor integrated circuit device according to claim 21; wherein the first constant-current source and the second constant-current source each comprise a MISFET having a channel provided with a plurality of impurity regions each having a different impurity concentration such that the first and second constant currents differ slightly.

29. A semiconductor integrated circuit device according to claim 28; wherein the MISFETs that form the first constant-current source and the second constant-current source each have the same channel length and channel width and have a different impurity concentration distribution such that the first and second constant currents differ slightly.

30. A semiconductor integrated circuit device according to claim 21; further comprising a capacitor for charge accumulation connected to one of the first and second constant-current sources; and a voltage comparator circuit for comparing a reference voltage with a terminal voltage of the capacitor and producing an output signal when the terminal voltage of the capacitor is equal to the reference voltage.

31. A semiconductor integrated circuit device according to claim 30; further comprising a current mirror circuit connected to the first constant-current source and the second constant-current source; an output terminal connected to the capacitor and to a node of the second constant-current source and the current mirror circuit; a timer reset MISFET connected to the output terminal; and a junction diode having the same area as the drain junction area of the timer reset MISFET connected to a node of the first constant-current source and the current mirror circuit to offset a drain leakage current of the timer reset MISFET.

32. A semiconductor integrated circuit device according to claim 30; further comprising a current mirror circuit connected to the first constant-current source and the second constant-current source; an output terminal connected to the capacitor and to a node of the second constant-current source and the current mirror circuit; a timer reset MISFET connected to the output terminal; and a MISFET having the same channel length and channel width as the timer reset MISFET and which is in a normally OFF-state when the timer is operative connected to a node of the first constant-current source and the current mirror circuit.

* * * * *